(12) United States Patent
Hosomi et al.

(10) Patent No.: US 7,492,570 B2
(45) Date of Patent: Feb. 17, 2009

(54) SYSTEMS AND METHODS FOR REDUCING SIMULTANEOUS SWITCHING NOISE IN AN INTEGRATED CIRCUIT

(75) Inventors: Eiichi Hosomi, Austin, TX (US); Paul M. Harvey, Austin, TX (US)

(73) Assignees: Kabushiki Kaisha Toshiba, Tokyo (JP); International Business Machines Corporation, Armonk, NY (US)

( * ) Notice: Subject to any disclaimer, the term of this patent is extended or adjusted under 35 U.S.C. 154(b) by 54 days.

(21) Appl. No.: 11/105,113

(22) Filed: Apr. 13, 2005

(65) Prior Publication Data

US 2006/0231947 A1    Oct. 19, 2006

(51) Int. Cl.
*H01G 4/228* (2006.01)

(52) U.S. Cl. .............. 361/306.2; 361/306.1; 361/306.3; 361/321.1; 361/311; 361/303

(58) Field of Classification Search .............. 361/306.2, 361/306.3, 321.1, 321.4, 704, 785, 306.1, 361/302–305, 311–313; 257/685–686, 777–778
See application file for complete search history.

(56) References Cited

U.S. PATENT DOCUMENTS

| | | | | |
|---|---|---|---|---|
| 5,103,283 A | * | 4/1992 | Hite | 257/724 |
| 5,272,590 A | * | 12/1993 | Hernandez | 361/306.2 |
| 5,694,297 A | * | 12/1997 | Smith et al. | 361/785 |
| 6,430,058 B1 | * | 8/2002 | Sankman et al. | 361/773 |
| 6,469,895 B1 | * | 10/2002 | Smith et al. | 361/704 |
| 6,611,419 B1 | * | 8/2003 | Chakravorty | 361/306.3 |
| 6,920,051 B2 | * | 7/2005 | Figueroa et al. | 361/763 |
| 6,995,463 B1 | * | 2/2006 | Sutardja | 257/686 |
| 7,173,329 B2 | * | 2/2007 | Frutschy et al. | 257/698 |

OTHER PUBLICATIONS

"Intel Pentium 4 Processor in the 423-pin Package," Data sheet; Aug. 2001.

* cited by examiner

*Primary Examiner*—Nguyen T Ha
(74) *Attorney, Agent, or Firm*—Law Offices of Mark L. Berrier (57) ABSTRACT

Systems and methods for reducing switching noise in an integrated circuit. In one embodiment, decoupling capacitors are connected to the integrated circuit from the underside of the substrate on which the integrated circuit die is manufactured. The decoupling capacitors are positioned with a higher concentration in the "hot spot" areas of the integrated circuit instead of being evenly distributed. In one embodiment, the decoupling capacitors and the corresponding hole(s) in a circuit board on which the integrated circuit is mounted are positioned so that the circuit board provides support for the central portion of the integrated circuit and thereby prevents the integrated circuit from flexing away from the heat sink/spreader. In one embodiment, the concentration of vias connecting the different ground planes and/or power planes within the integrated circuit is higher in hot spots than in other areas.

16 Claims, 9 Drawing Sheets

SYSTEMS AND METHODS FOR REDUCING SIMULTANEOUS SWITCHING NOISE IN AN INTEGRATED CIRCUIT

BACKGROUND

1. Field of the Invention

The invention relates generally to integrated circuits, and more particularly to systems and methods for reducing simultaneous switching noise within integrated circuits by providing decoupling capacitors that are positioned with higher concentrations near hot spots in the integrated circuits.

2. Related Art

As computer-related technologies have developed, technical advances have been matched by a demand for increased speed and processing capacity. This has resulted in the development of integrated circuits with larger and larger numbers of smaller and smaller circuit components. Integrated circuits commonly contain millions of transistors that form the various logic gates, latches, amplifiers and other components within the integrated circuits.

As the complexity of an integrated circuit increases, and the number of components in the integrated circuit grows, designers are often faced with problems that were either less acute in earlier, less complex circuits, or were not present at all in these circuits. For example, as the number of transistors in integrated circuits increases, the amount of simultaneous switching noise generated by the transistors typically increases as well. This switching noise can reduce the performance of the integrated circuits or even impede their proper functioning.

The problem of increased switching noise is conventionally addressed by connecting decoupling capacitors to the integrated circuit. The decoupling capacitors are typically positioned externally to the integrated circuit package, with one of the leads of each decoupling capacitor connected to the ground planes in the integrated circuit, and the other lead connected to the power planes in the integrated circuit.

Conventionally, the decoupling capacitors are positioned on the underside of the substrate on which the integrated circuit die is manufactured. This allows the decoupling capacitors to be located close to the integrated circuit die, while also allowing a heat sink or heat spreader to be placed in contact with the integrated circuit die. The decoupling capacitors are typically distributed evenly across the area on the underside of the integrated circuit die. Because the height of the decoupling capacitors is usually greater than the height of the connectors between the integrated circuit and the circuit board on which it is mounted, it is necessary to form a hole in the circuit board through which the decoupling capacitors can extend.

While this conventional technique does reduce the switching noise in the integrated circuit, it has several drawbacks. For instance, the hole in the circuit board allows the integrated circuit to flex under pressure from the heat sink/spreader, which reduces the thermal contact between the integrated circuit and the heat sink/spreader. Further, the even distribution of the decoupling capacitors across the integrated circuit is not optimal for reduction of switching noise.

SUMMARY OF THE INVENTION

One or more of the problems outlined above may be solved by the various embodiments of the invention. Broadly speaking, the invention includes systems and methods for reducing switching noise in an integrated circuit without reducing the effectiveness of a heat sink/spreader that is used with the integrated circuit. In one embodiment, decoupling capacitors are connected to the integrated circuit from the underside of the substrate on which the integrated circuit die is manufactured. The decoupling capacitors are positioned with a higher concentration in the "hot spot" areas of the integrated circuit instead of being evenly distributed. In one embodiment, the decoupling capacitors and the corresponding hole(s) in the circuit board (through which the decoupling capacitors fit) are positioned to provide support to the central portion of the integrated circuit and to thereby prevent the integrated circuit from flexing away from the heat sink/spreader. In one embodiment, the concentration of vias connecting the different ground planes and/or power planes within the integrated circuit is higher in hot spots than in other areas.

One embodiment comprises a device including an integrated circuit die and one or more decoupling capacitors. The decoupling capacitors are externally connected to the integrated circuit die at positions such that there is a higher concentration of the decoupling capacitors at hot spots within the integrated circuit die. In one embodiment, the integrated circuit die is mounted on a substrate, and the decoupling capacitors are connected to the integrated circuit die through the substrate. The substrate may be mounted to a circuit board having one or more holes formed therethrough. The holes are positioned so that when the substrate is mounted to the circuit board, the decoupling capacitors extend through the holes. The circuit board may include a portion that is located under a central portion of the integrated circuit die, so that connectors on the substrate are supported by this portion of the circuit board. The device may also include a heat sink/spreader which is positioned in thermal contact with the integrated circuit die. A coupling, such as a backing plate and connecting pins, may be used to apply pressure to the heat sink/spreader in order to maintain the thermal contact with the integrated circuit die. The integrated circuit die may also include vias connecting ground and/or power planes in the integrated circuit die, where the concentration of the vias is higher at the hot spots than in other areas on the integrated circuit die.

Another embodiment comprises a circuit board configured to have an integrated circuit mounted to it. The circuit includes one or more holes formed in it which are positioned to allow decoupling capacitors connected to the integrated circuit to extend through the holes. The circuit board also includes a portion that is positioned centrally under the integrated circuit die to provide support to connectors on a substrate under the central portion of the integrated circuit die.

Another embodiment comprises a method including providing an integrated circuit die, positioning one or more decoupling capacitors with a higher concentration at hot spots in the integrated circuit die, and connecting the decoupling capacitors to power and/or ground planes within the integrated circuit die.

In one embodiment, the integrated circuit die is mounted on a substrate, and the decoupling capacitors are connected to the integrated circuit die through the substrate. The method may include providing a circuit board and forming holes in it, then mounting the substrate to the circuit board. The holes are positioned so that when the substrate is mounted to the circuit board, the decoupling capacitors extend through the holes. The circuit board may be formed so that a portion of the circuit board is positioned to provide support to a central portion of the integrated circuit die. The method may also include positioning a heat sink/spreader in thermal contact with the integrated circuit die and applying pressure to the heat sink/spreader to maintain thermal contact with the integrated circuit die. The method may also include forming vias in the integrated circuit die which connect ground and/or power planes in the die, where the concentration of the vias is higher at the hot spots than in other areas on the integrated circuit die.

Numerous additional embodiments are also possible.

BRIEF DESCRIPTION OF THE DRAWINGS

Other objects and advantages of the invention may become apparent upon reading the following detailed description and upon reference to the accompanying drawings.

While the invention is subject to various modifications and alternative forms, specific embodiments thereof are shown by way of example in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF EXEMPLARY EMBODIMENTS

One or more embodiments of the invention are described below. It should be noted that these and any other embodiments described below are exemplary and are intended to be illustrative of the invention rather than limiting.

Broadly speaking, the invention includes systems and methods for reducing switching noise in an integrated circuit. In one embodiment, decoupling capacitors are connected to the integrated circuit in a configuration that positions the decoupling capacitors near hot spots in the integrated circuit. The circuit board on which the integrated circuit is mounted may include one or more holes through which the decoupling capacitors can extend, where the holes are shaped to provide support to the central portion of the integrated circuit die. Additionally, vias connecting the ground planes in the integrated circuit and vias connecting the power planes in the integrated circuit may be formed in greater concentrations in the vicinity of the hot spots.

Before discussing the invention in detail, the conventional configuration and mounting of an integrated circuit will be described in order to more clearly point out the problems associated with conventional techniques and the advantages of the various embodiments of the present invention.

Figure 1A:
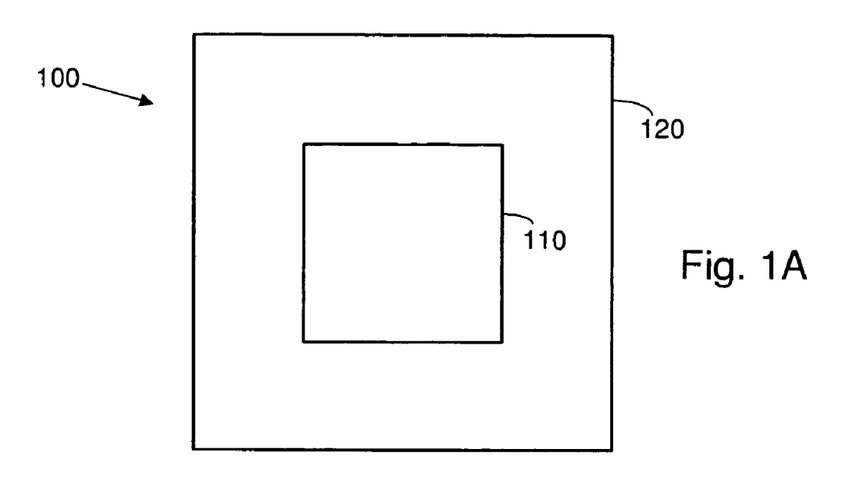
FIGS. 1A-1C are a set of diagrams illustrating the structure of an integrated circuit package in accordance with the prior art.
Figure 1B:
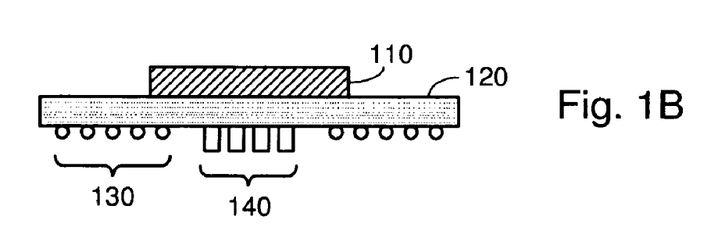
Figure 1C:
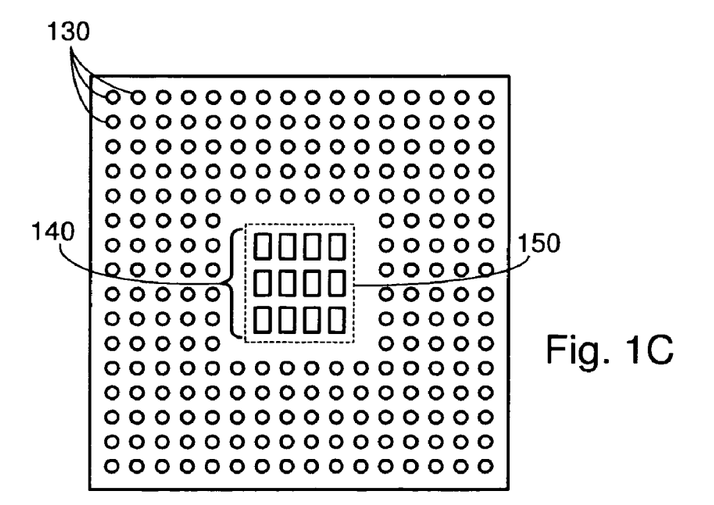

Referring to FIGS. 1A-1C, a set of diagrams illustrating the structure of an integrated circuit package in accordance with the prior art is shown. FIG. 1A is a top view of an integrated circuit die on a substrate. FIG. 1B is a cross-sectional view of the integrated circuit die on the substrate showing some of the decoupling capacitors and BGA ball connectors. FIG. 1C is a bottom view of the substrate showing the positioning of the decoupling capacitors and the BGA ball connectors.

Referring to FIG. 1A, an integrated circuit package 100 includes an integrated circuit die 110 and a substrate 120. Integrated circuit die 110 contains the logic gates, latches, and other components that form the functional circuitry of the integrated circuit. Integrated circuit die 110 is mounted on substrate 120 in order to provide a more robust package that can be mounted on a circuit board. The integrated circuit can thereby be incorporated into a larger circuit or device.

The physical inputs to and outputs from integrated circuit die 110 are connected to wires or traces (not shown) on substrate 120. These wires or traces are also coupled to a connector means on substrate 120. The connector means is, as noted above, provided to allow the integrated circuit to be coupled to a circuit board so that the integrated circuit can interact with other components of a larger device. As shown in FIGS. 1B and 1C, the connector means consists of a set of BGA (ball grid array) balls 130.

"Traces," as used here, refers to the patterned layers of conductive material (e.g., aluminum) that are formed in the integrated circuit die to connect components of the integrated circuit. The traces serve the same purpose as wires in non-integrated circuits.

While most current integrated circuits (e.g., microprocessors) are packaged using a PGA (pin grid array) connector means, the embodiments described herein use BGA ball connectors in order to provide improved performance. Although PGA connectors are easy to install and remove from circuit boards, it may be difficult when using these connectors to maintain conditions that are desirable for purposes of signal integrity. This is because the long pins and sockets of a PGA connector have relatively large inductances. These inductances may be problematic when the operating speed of the integrated circuit is high (e.g., 1 GHz.) Because a BGA connection has a small balls of solder instead of long pins, and because the connection is assembled directly on the circuit board instead of being plugged into a socket, the BGA connection has better electrical performance than a PGA connector.

Referring to FIG. 1C, the arrangement of BGA balls 130 and decoupling capacitors 140 on the underside of substrate 120 is shown. (It should be noted that, while only a few of the BGA balls are explicitly indicated by reference number 130, and only a few of the decoupling capacitors are explicitly indicated by reference number 140, these reference numbers are intended to refer to any/all of the identical items shown in figure.) It can be seen that BGA balls 130 are arranged in a regular, rectangular pattern, or grid, across the substrate, except that there are no BGA balls within a central portion 150 of the substrate. Decoupling capacitors 140 are arranged in a regular, rectangular pattern within central portion 150.

Figure 2:
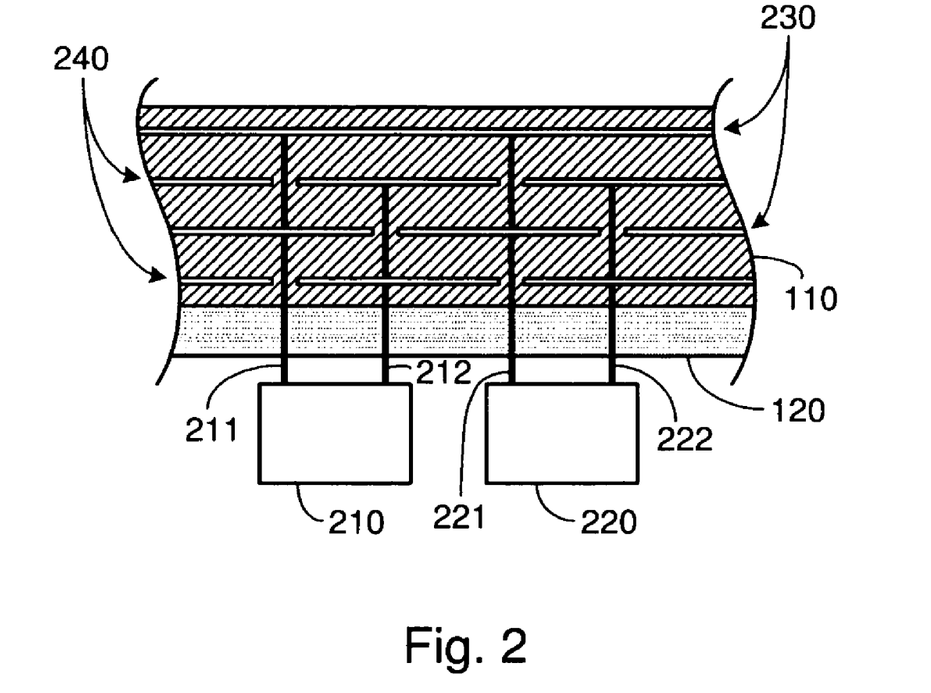
FIG. 2 is a diagram illustrating the connection of the decoupling capacitors to the ground and power planes within the integrated circuit of FIGS. 1A-1C.

Referring to FIG. 2, a diagram illustrating the connection of the decoupling capacitors to the ground and power planes within the integrated circuit is shown. FIG. 2 shows a small cross-section of the integrated circuit in the vicinity of decoupling capacitors 210 and 220. As described above, decoupling capacitors 210 and 220 are positioned on the underside of substrate 120. Each of decoupling capacitors 210 and 220 has a pair of leads—211 and 212 for decoupling capacitor 210, and 221 and 222 for decoupling capacitor 220. It should be noted that these two-lead capacitors are depicted for the sake of simplicity, and the capacitors used in some embodiments may have more (e.g., eight or ten) leads in order to reduce their inductance. One lead of each of the decoupling capacitors (e.g., leads 211 and 221) is connected to the power planes 230 within integrated circuit die 110. The other lead of each of the decoupling capacitors (e.g., leads 212 and 222) is connected to the ground planes 240 within integrated circuit die 110. The capacitance between the ground and power planes which is provided by the decoupling capacitors serves to shunt high-frequency signals (e.g., switching noise) between the planes, while isolating the respective DC voltages.

Figure 3A:
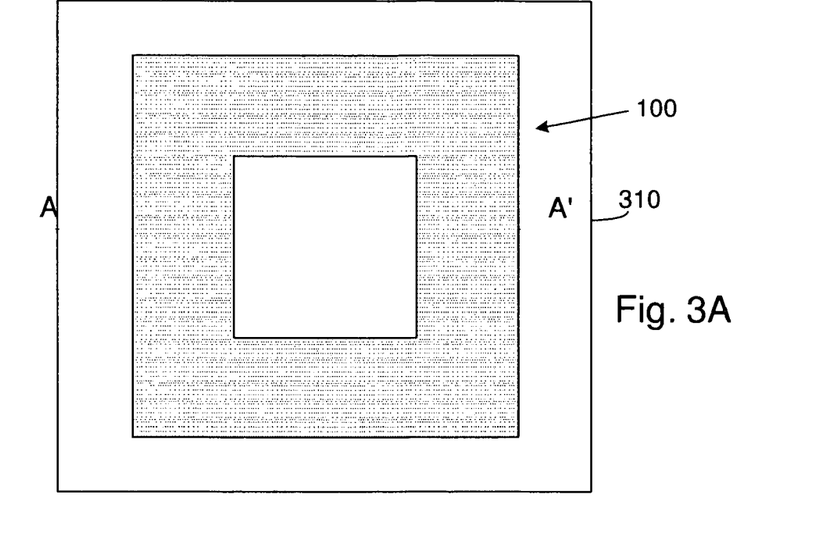
FIGS. 3A-3C are a set of diagrams illustrating the mounting of an integrated circuit package on a circuit board in accordance with the prior art.
Figure 3B:
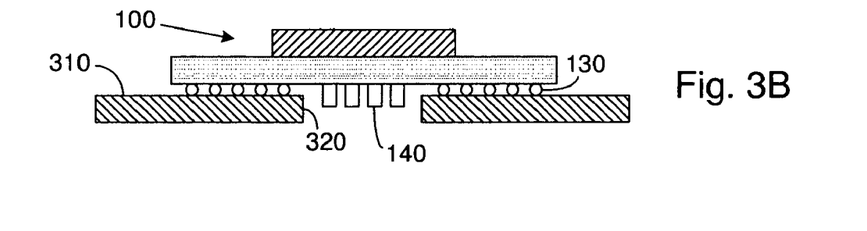
Figure 3C:
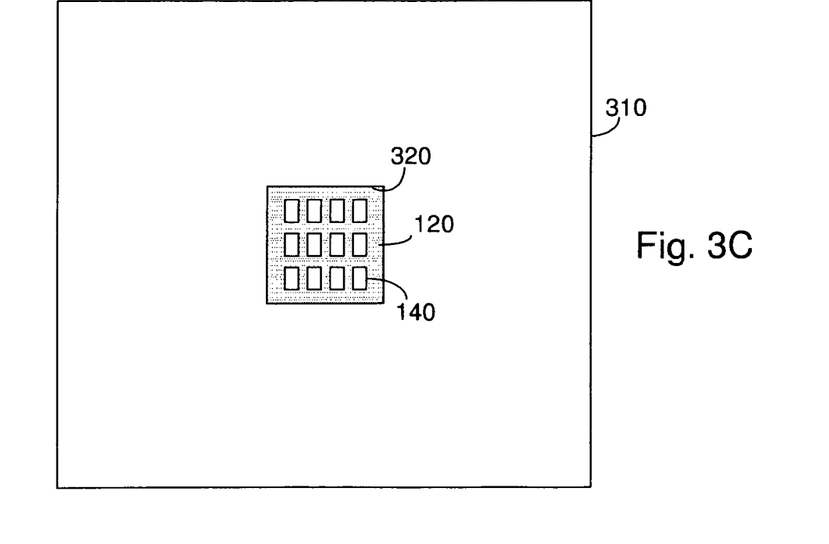

Referring to FIGS. 3A-3C, a set of diagrams illustrating the mounting of an integrated circuit package on a circuit board in accordance with the prior art is shown. FIG. 3A is a top view of the integrated circuit package on the circuit board. FIG. 3B is a cross-sectional view of the integrated circuit package on the circuit board. FIG. 3C is a bottom view of the circuit board, with a portion of the integrated circuit package and decoupling capacitors showing through a hole in the circuit board.

Referring to FIG. 3A, integrated circuit package 100 is mounted on a printed circuit board 310. The inputs and outputs of integrated circuit package 100 are directly connected to conductive traces on the circuit board via BGA balls 130 on the underside of the integrated circuit package. This connection can be seen more clearly in FIG. 3B.

Typically, BGA balls 130 are small in comparison to decoupling capacitors 140. For instance, the BGA balls may be approximately 0.4 mm high, while the decoupling capacitors may be approximately 0.8 mm. It is therefore apparent that decoupling capacitors 140 could not fit between integrated circuit package 100 and circuit board 310, which are spaced apart by the height of BGA balls 130. It is therefore necessary to form a hole 320 in circuit board 310. When integrated circuit package 100 is mounted on circuit board 310, decoupling capacitors 140 extend into hole 320 and consequently do not interfere with the connection of integrated circuit package 100 to circuit board 310.

Because integrated circuits such as high-performance microprocessors typically consume a great deal of power, it is often necessary to provide a mechanism for dissipating the heat that is generated by the integrated circuits when they are operated. A heat sink or heat spreader is commonly used for this purpose. A sink is used to draw heat away from the integrated circuit. A heat spreader is used to distribute the heat that is generated in particular spots over a larger area. Normally, both functions are achieved by the same physical structure (e.g., a metal plate with fins or other structures that is placed in thermal contact with the integrated circuit,) so no distinction will be made between the two in this disclosure.

Figure 4A:
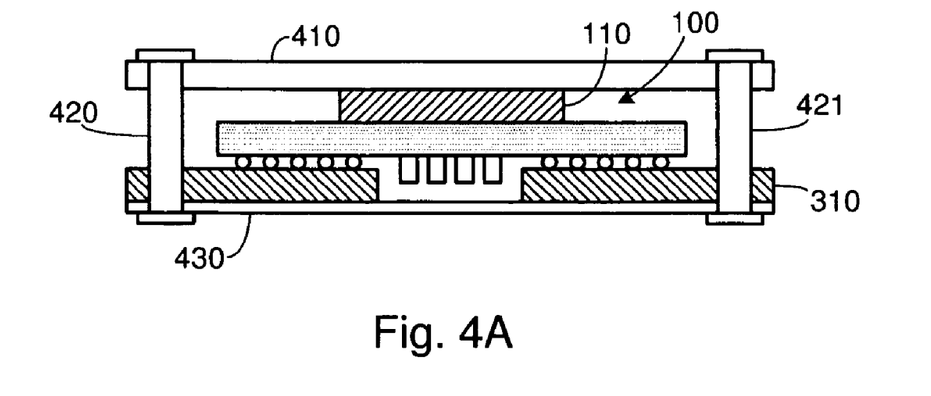
FIGS. 4A-4B are a set of diagrams illustrating the coupling of a heat sink/spreader to an integrated circuit package in accordance with the prior art.
Figure 4B:
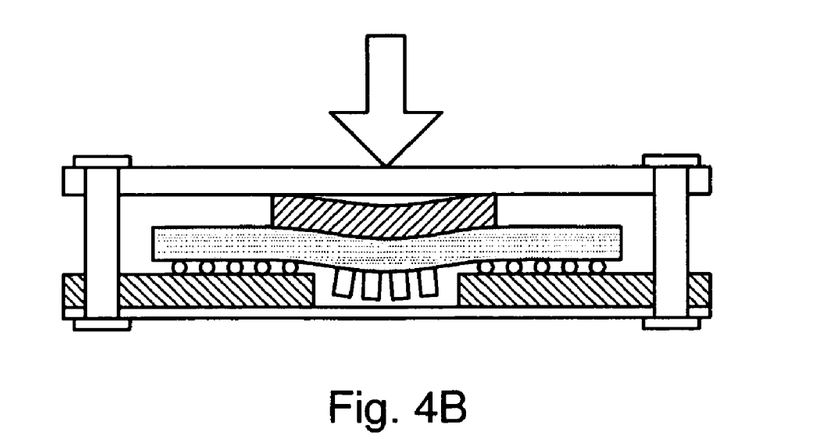

Referring to FIGS. 4A-4B, a set of diagrams illustrating the coupling of a heat sink/spreader to an integrated circuit package in accordance with the prior art is shown. FIG. 4A shows the arrangement of the circuit board, integrated circuit package and heat sink/spreader with little or no pressure applied to the heat sink/spreader. FIG. 4B shows the same arrangement as FIG. 4A, but with pressure applied to the heat sink/spreader.

Referring to FIG. 4A, integrated circuit package 100 is mounted on circuit board 310 as described above. Heat sink/spreader 410 is then placed in contact with the upper surface of integrated circuit die 110. Typically, the contacting surfaces of heat sink/spreader 410 and integrated circuit die 110 match (e.g., they are both flat) so that good thermal contact can be made between the two. A substance having high thermal conductivity (which may be referred to as a thermal interface material, or TIM) may be placed between these two components to improve the thermal transfer from integrated circuit die 110 to heat sink/spreader 410.

The efficiency of the thermal transfer between two items that are thermally coupled in this manner can typically be improved by applying pressure to the items to force them together. This reduces the thickness of the layer of thermal interface material between the items. In the diagrams of FIGS. 4A-4B, pressure is applied to heat sink/spreader 410 by positioning a back plate against the underside of circuit board 310 opposite the heat sink/spreader. A set of pins are placed through heat sink/spreader 410 and back plate 430 and tightened in order to press the heat sink/spreader against integrated circuit die 110. Because there is a hole in circuit board 310, however, applying pressure to heat sink/spreader 410 in this manner may actually reduce the efficiency of the heat transfer from integrated circuit die 110 because the pressure causes integrated circuit die 110 (and the rest of integrated circuit package 100) to flex toward the hole and away from heat sink/spreader 410. This can cause a gap to form between integrated circuit die 110 and heat sink/spreader 410, increasing the thickness of the layer of thermal interface material (or creating a gap if no thermal interface material is used) and thereby impeding the transfer of heat between the integrated circuit die and the heat sink/spreader.

In one embodiment of the present invention, the decoupling capacitors are positioned near the "hot spots" of the integrated circuit, rather than in regularly spaced positions that are evenly distributed across the area of the integrated circuit die. By positioning the decoupling capacitors close to the hot spots, the switching noise is more effectively reduced. Additionally, when the decoupling capacitors are distributed unevenly, the hole that is formed in the circuit board to accommodate the decoupling capacitors can be shaped to provide support to the central portion of the integrated circuit. This can reduce or eliminate the flexing of the integrated circuit that reduces the effectiveness of the thermal coupling between the integrated circuit die and the heat sink/spreader. The switching noise in the integrated circuit can also be reduced by providing an increased concentration of vias connecting the ground planes and/or power planes in the integrated circuit.

In many instances, the physical layout of an integrated circuit will have one or more areas that include a higher concentration of components that experience a high level of activity during normal operation. Because there is a high level of activity in these areas, the amount of power used by the circuit components in these areas is higher than in other areas. Consequently, a greater amount of heat is dissipated in these areas than in other areas of the integrated circuit. Because of the higher levels of activity and greater power dissipation in these areas, they are often referred to as "hot spots."

Figure 5A:
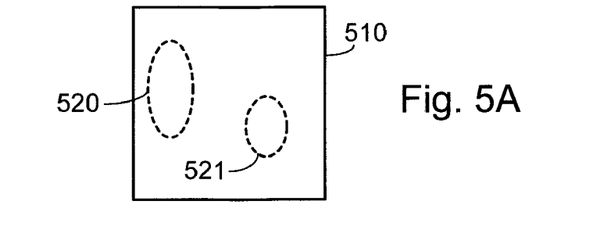
FIG. 5A-5C are a set of diagrams illustrating hot spots on an integrated circuit and the configuration of decoupling capacitors and other features of an integrated circuit package and circuit board in accordance with one embodiment.

Referring to FIG. 5A, a diagram illustrating hot spots on an integrated circuit die in one embodiment is shown. In this embodiment, integrated circuit die 510 includes two hot spots, 520 and 521. These are areas of the die in which there is a relatively high level of activity during operation of the integrated circuit. It should be noted that the hot spots, which are indicated generally by the dotted lines in the figure, do not indicate distinct changes in the level of activity and corresponding heat dissipation, as these levels change gradually from areas of very high activity/heat to areas having much lower activity/heat. The dotted lines merely indicate the general area of each hot spot. It should also be noted that, while FIG. 5A depicts two hot spots, other integrated circuits may have more or fewer hot spots, and these hot spots may be regularly or irregularly shaped.

It has been determined that the use of decoupling capacitors to reduce simultaneous switching noise is more effective when the decoupling capacitors are connected to the integrated circuit at or near the hot spots than when the decoupling capacitors are distributed evenly across the area of the integrated circuit die. Thus, the conventional technique of positioning the decoupling capacitors on the integrated circuit die in a regular pattern (such as the pattern illustrated in FIGS. 1 and 2) is less effective than a pattern that places a higher concentration of decoupling capacitors at or near the hot spots (such as the pattern illustrated in FIGS. 6-8.)

Because of the fact that the extent of each hot spot is not well defined, and because the decoupling capacitors have finite physical extent, the placement of the decoupling capacitors cannot exactly match the boundaries of the hot spots. Consequently, the placement of the decoupling capacitors will be described herein in terms of the distribution or concentration of the capacitors (number of capacitors per unit area) in relation to the hot spots. Rather than employing the conventional technique of placing the capacitors in a regularly spaced array, which corresponds to an even distribution across the area of the integrated circuit die, the present embodiments places capacitors in an irregularly spaced arrangement which corresponds to an uneven distribution across the area of the integrated circuit die. This uneven distribution of decoupling capacitors has a higher concentration of the capacitors at or near the hot spots, and a lower concentration in areas that do not include hot spots.

Figure 5B:
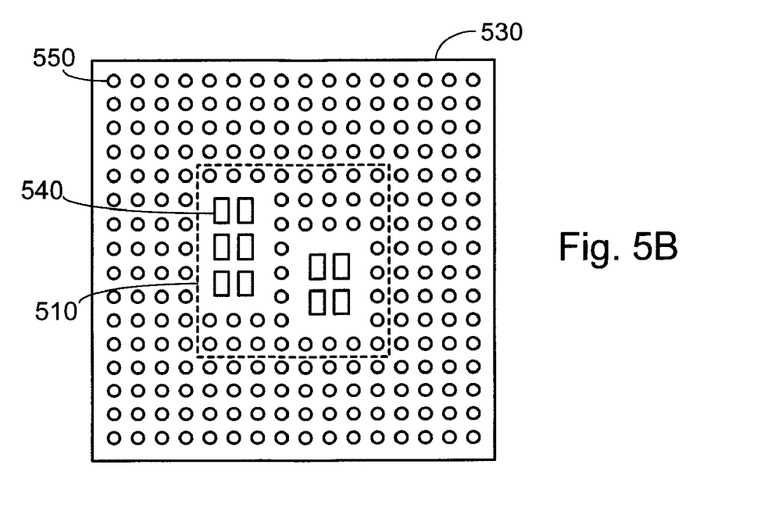

Referring to FIG. 5B, a diagram illustrating the positioning of decoupling capacitors and BGA ball connectors on the underside of an integrated circuit package in accordance with one embodiment is shown. This figure depicts the underside of the substrate 530 on which integrated circuit die 510 is mounted. It should be noted that integrated circuit die 510 in FIG. 5A is viewed from underneath, so the orientation of die 510 is the same in FIG. 5A as it is in a mounted position on substrate 530 of FIG. 5B. The position of hot spots 520 and 521 is therefore the same in FIG. 5B as is shown in FIG. 5A.

The position of integrated circuit die 510 on the opposite side of substrate 530 is indicated by the dotted line in FIG. 5B. It can be seen from FIGS. 5A and 5B that decoupling capacitors 540 are positioned on hot spots 520 and 521. A grouping of six decoupling capacitors is positioned on hot spot 520, while a grouping of four decoupling capacitors is positioned on hot spot 521. Because much of the switching activity in the integrated circuit occurs at hot spots 520 and 521, the positioning of decoupling capacitors 540 on these hot spots more effectively reduces simultaneous switching noise than an even distribution As mentioned above, the extent of each hot spot cannot be exactly defined, so references herein to the decoupling capacitors being positioned "on" hot spots indicates a general, rather than exact, correlation between the decoupling capacitor positions and the hot spot positions. The positioning of the decoupling capacitors on the hot spots may alternately be referred to in terms of the concentration of decoupling capacitors in areas of the hot spots. It can be seen in FIG. 5B that the concentration of decoupling capacitors is higher in the areas of hot spots 520 and 521 than in areas of integrated circuit die 510 that are removed from the hot spots (e.g., the upper, right-hand corner of the integrated circuit die.)

As noted above, the positioning of the decoupling capacitors with a higher concentration near the hot spots in the integrated circuit die may allow the added benefit of configuring the circuit board on which the integrated circuit will be mounted to provide support to the central portion of the integrated circuit die. As shown in FIG. 5B, decoupling capacitors 540 are grouped in two sets, one of which is on the left side of the integrated circuit die, and the other of which is on the right side of the integrated circuit die. The spacing between these two groupings of decoupling capacitors allows a series of BGA balls to be positioned between the two sets of decoupling capacitors. These and BGA balls will contact a corresponding portion of the circuit board on which the integrated circuit package will be mounted, thereby supporting the central portion of the integrated circuit package.

Figure 5C:
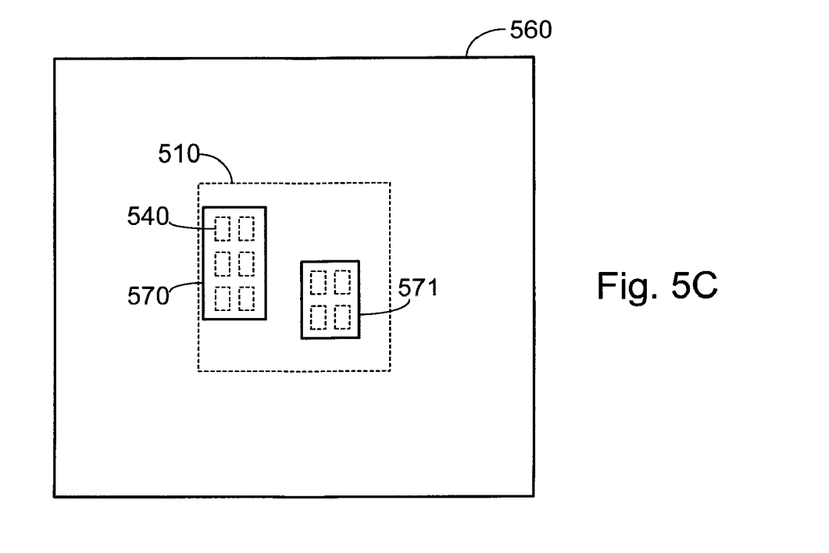

Referring to FIG. 5C, a view of the underside of a circuit board 560 with the integrated circuit package mounted thereon is shown. Again, the position of integrated circuit die 510 is indicated by dotted lines in this figure. Rather than having a single large hole generally matching the extent of integrated circuit die 510 (as in the prior art,) circuit board 560 includes two holes, 570 and 571 to accommodate the two sets of decoupling capacitors on the underside of the integrated circuit package. The positions of the decoupling capacitors are also shown by dotted lines in this figure. It should be noted that circuit board 560 includes a portion between holes 570 and 571 which contacts the series of BGA balls that are positioned between the two sets of decoupling capacitors on the integrated circuit package. This portion of circuit board 560 provides support to the central portion of the integrated circuit package.

Figure 6:
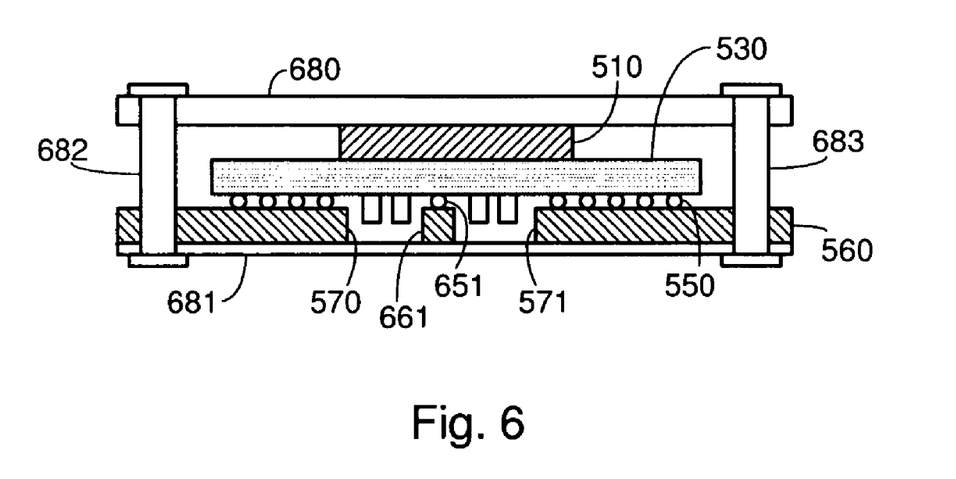
FIG. 6 is a cross-sectional view of the integrated circuit package and circuit board shown in FIGS. 5A-5C.

Referring to FIG. 6, a cross-sectional view of the integrated circuit package and circuit board illustrated in FIGS. 5A-5C is shown. In this figure, the integrated circuit package (consisting of integrated circuit die 510, substrate 530, decoupling capacitors 540 and BGA balls 550) is mounted on circuit board 560. Heat sink/spreader 680 is placed in contact with integrated circuit die 510, and pressure is applied to the heat sink/spreader by placing a backing plate 681 under circuit board 560 and connecting the heat sink/spreaders to the backing plate using pins 682 and 683. It can be seen more clearly in this figure that the portion (661) of circuit board 560 between holes 570 and 571 contacts the series of BGA balls (651) between the two sets of decoupling capacitors to provide support to the central portion of the integrated circuit package. As a result, when pressure is applied to heat sink/spreader 680, the integrated circuit package is not allowed to flex away from the heat sink/spreader, so good thermal contact is maintained between integrated circuit die 510 and the heat sink/spreader. Thus, the simultaneous switching noise in the integrated circuit is reduced through the use of decoupling capacitors without adversely impacting the effectiveness of the heat sink/spreader.

As noted above, the simultaneous switching noise in the integrated circuit can also be reduced through proper placement of vias between the ground and power planes in the integrated circuit substrate. Typically, an integrated circuit substrate includes multiple layers. Each layer may contain various circuit components and conductive traces. Connections between components or traces in different layers may be made by vias in the integrated circuit substrate. Vias are electrical interconnections that are typically formed by drilling a hole through one or more layers of the integrated circuit substrate and filling (or coating) the hole with solder.

Typically, the electrical components in each layer of an integrated circuit must have a source of power and a ground connection. Consequently, there are normally a number of electrical traces on each layer that are connected to a source voltage (e.g., Vdd,) as well as a number of traces that are connected to a ground potential. For the purposes of this disclosure, the traces on a layer which are at the source voltage potential are referred to as a power plane, while the traces on a layer which are at the ground potential are referred to as a ground plane. Multiple vias are normally formed to connect the power/ground planes on the different layers to each other and to the decoupling capacitors. Conventionally, these vias are formed in whatever locations might be convenient.

It has been determined that the presence of these vias connected to the power planes and/or ground planes are beneficial in the reduction of simultaneous switching noise. Because these vias are beneficial, some of the present embodiments use them to provide additional noise reduction. More specifically, rather than placing these vias at convenient locations without regard to hot spots in the integrated circuit, they are positioned so that there is a higher concentration of the vias (i.e. the number of vias per unit area) at or near the hot spots, and a lower concentration of the vias in other areas of the integrated circuit.

Figure 7:
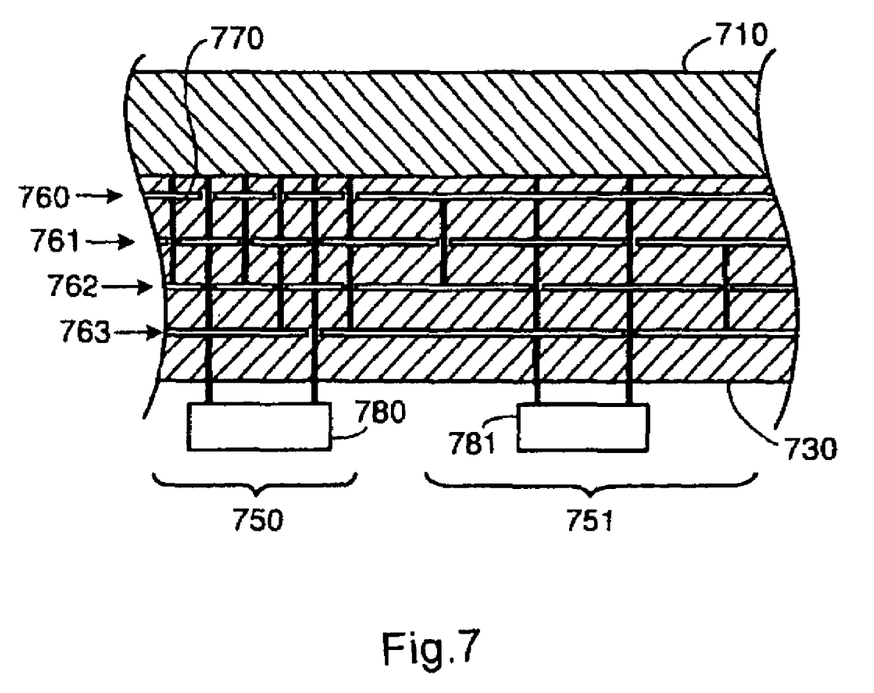
FIG. 7 is a cross-sectional representation of an integrated circuit die and substrate showing the interconnection of the ground and power planes by corresponding vias in accordance with one embodiment.

The varying concentrations of vias between the ground and/or power planes is illustrated with reference to FIG. 7. This figure is a cross-sectional representation of the integrated circuit substrate showing the interconnection of ground and power planes by corresponding vias. In this figure, integrated circuit die 710 is mounted on substrate 730. Substrate 730 incorporates multiple layers, each of which may have a ground plane and a power plane. In FIG. 7, four such planes (760-763) are depicted. It is assumed that two of these planes are power planes and two are ground planes. For example, planes 760 and 762 may be power planes, while planes 761 and 763 may be ground planes. Multiple vias (e.g., 770) connect power planes 760 to power planes 762. Similarly, multiple vias connect power planes 761 to power planes 763. Multiple vias also connect the ground and power planes to decoupling capacitors 780 and 781. A first portion 750 of the integrated circuit die is assumed to be a hot spot, while it is assumed that a second portion 751 is not a hot spot. It can be seen that the concentration of vias in the area of the hot spot (portion 750 of the integrated circuit die) is higher than the concentration in the non-hot spot area (portion 751.)

Although only one of the vias is explicitly indicated by reference number 770 in the figure, this reference number is intended to refer to the vias collectively. Only one of the vias is explicitly indicated by this reference number for purposes of clarity.

It should be noted that, as with the distribution of the decoupling capacitors, the placement of the vias interconnecting the power and/or ground planes cannot have an exact correspondence to the ill-defined boundaries of the hot spots, so references herein to the concentration of vias should be taken as a reference to the generally closer spacing of vias in the vicinity of the hot spots.

The foregoing description is directed to specific embodiments of the invention. These embodiments are intended to be illustrative, and many variations of the features described above may be included in alternative embodiments. For instance, it is contemplated that the locations of hot spots may vary considerably between integrated circuits having different designs. The positions of decoupling capacitors that are connected to these different integrated circuits will therefore also vary. The configurations of the circuit boards on which these integrated circuits are mounted will likewise vary with the differing positions at the hot spots and corresponding positions of the decoupling capacitors.

Referring to FIGS. 8A-8H a number of figures illustrating possible variations in the hotspot locations, decoupling capacitor locations and circuit board holes are shown. In each of these figures, the solid outer line (e.g., 860) represents the circuit board. The dotted square (e.g., 810) represents the position of the integrated circuit die. The solid inner lines (e.g., 870) represent the holes in the circuit board, and the small dotted rectangles (e.g., 840) represent the positions of the decoupling capacitors. While only the decoupling capacitors and corresponding holes in the circuit board are depicted in the figures, it is assumed that the positions of the decoupling capacitors correspond to the hot spots in the respective integrated circuits.

Figure 8A:
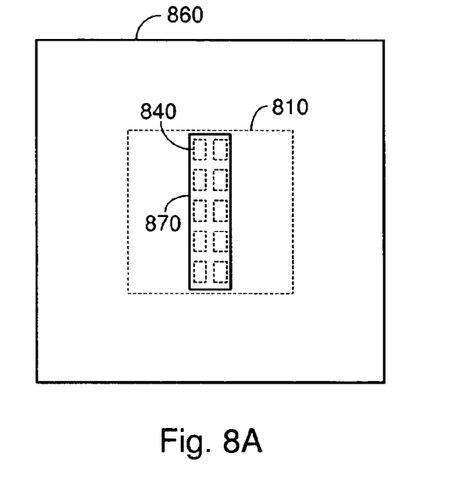
FIGS. 8A-8H are a set of diagrams illustrating possible variations in the hotspot locations, decoupling capacitor locations and circuit board holes in accordance with alternative embodiments.
Figure 8B:
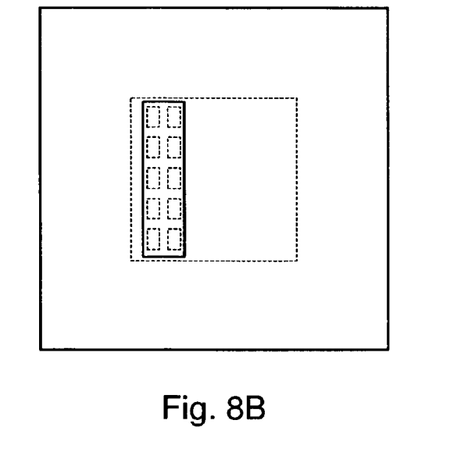

Referring to FIG. 8A, an embodiment having a single hole 870 in circuit board 860 is shown. In this embodiment, decoupling capacitors 840 are concentrated in a strip extending from the top of integrated circuit die 810 to the bottom of the die. Because hole 870 is narrow, the integrated circuit package will not tend to flex very much when pressure is applied to the package by the heat sink/spreader. Therefore, no additional support near the center of the die is necessary. Referring to FIG. 8B, another embodiment is shown in which the decoupling capacitors are configured in a near a strip across the area of the integrated circuit die. Because there are no decoupling capacitors near the center of the die, the circuit board provide support to the central portion of the die to oppose flexing of the die.

Figure 8C:
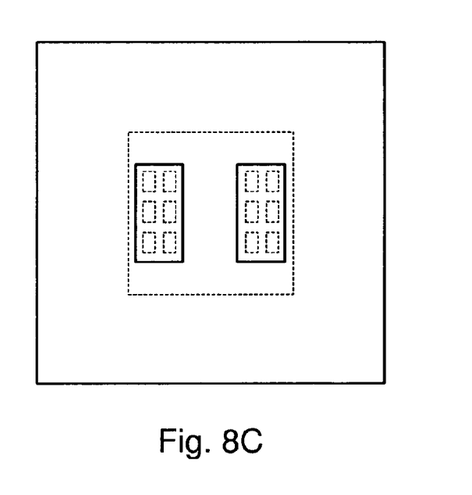
Figure 8D:
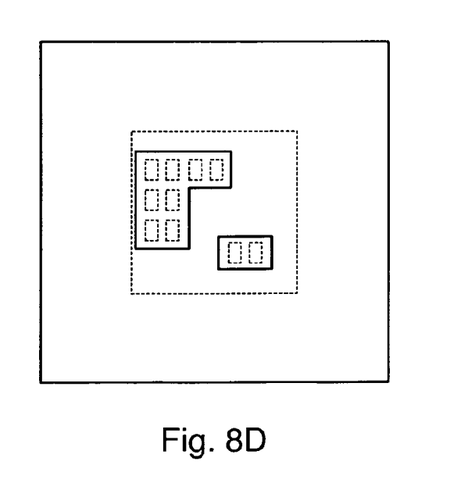

Referring to FIG. 8C, an embodiment is shown in which the decoupling capacitors are positioned in two symmetric groupings on opposite sides of the integrated circuit die. The circuit board includes a portion between the holes which accommodate these groupings of capacitors, so support can be provided to the central portion of the integrated circuit package. Referring to FIG. 8D, an alternative embodiment is shown in which there are again to groupings of decoupling capacitors and corresponding holes in the circuit board, but the groupings are more irregular. There is nevertheless space between the groupings so that the portion of the circuit board between the holes will provide support to the integrated circuit package.

Figure 8E:
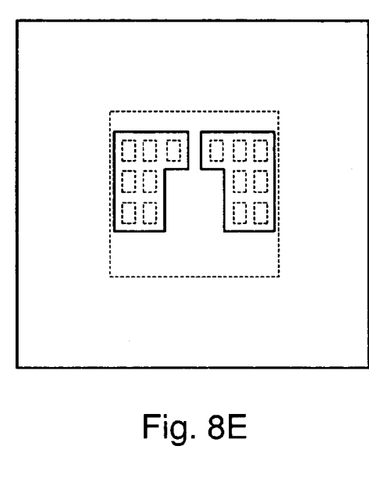
Figure 8F:
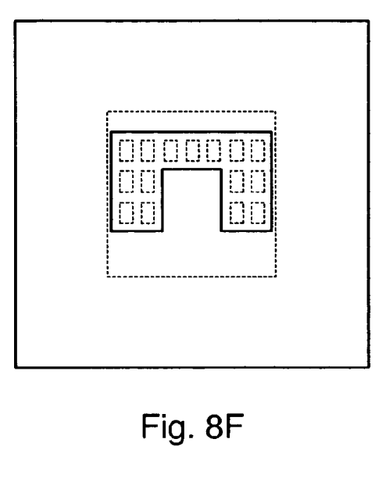

Referring to FIG. 8E, an embodiment is shown in which the decoupling capacitors are positioned into irregular, but symmetric groupings. A portion of the circuit board remains between the groupings to provide support for the central portion of the integrated circuit die (including a small strip between the closest capacitors in the two groupings to provide additional stability to the larger portion of the circuit board between the two groupings.) Referring to FIG. 8F, a single irregular grouping of decoupling capacitors is shown in a "C"-shaped configuration. The portion of the circuit board in the center of the "C" provide support to the central portion of the integrated circuit die.

Figure 8G:
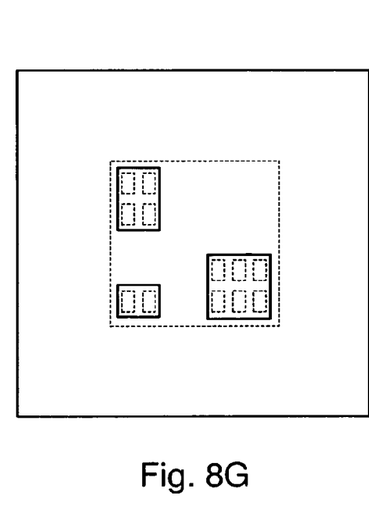
Figure 8H:
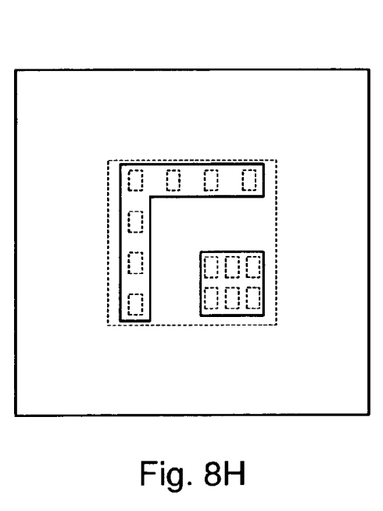

Referring to FIG. 8G, an embodiment is shown in which there are three groupings of decoupling capacitors. It should be noted that not only the positions, but also the number of hot spots in the different integrated circuits may vary. A portion of the circuit board remains between the larger groupings of decoupling capacitors to provide support to the integrated circuit die. Referring to FIG. 8H, an embodiment is shown in which there are two groupings at decoupling capacitors. In this embodiment, the decoupling capacitors in the group at the lower right-hand corner of the integrated circuit die are more closely spaced and the remainder of the decoupling capacitors. It should be noted that various embodiments may include decoupling capacitors that are not positioned at or near hot spots in the respective integrated circuits—the decoupling capacitors need not be positioned exclusively at the hot spots, but only with a higher concentration in these areas. In that embodiment of FIG. 8H, there is again a portion of the circuit board that can provide support to the central portion of the integrated circuit die.

Those of skill will further appreciate that the various illustrative logical blocks, modules, and algorithm steps described in connection with the embodiments disclosed herein may be implemented in various ways. To clearly illustrate this interchangeability, various illustrative components, blocks, modules, and steps have been described above generally in terms of their functionality. Those of skill in the art may implement the described functionality in varying ways for each particular application, but such implementation decisions should not be interpreted as causing a departure from the scope of the present invention.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein and recited within the following claims.

What is claimed is:

1. A device comprising:
an integrated circuit package including an integrated circuit die mounted on an integrated circuit substrate; and
one or more decoupling capacitors externally connected to the integrated circuit die through the integrated circuit substrate;
wherein the decoupling capacitors are positioned with a higher concentration of the decoupling capacitors at the one or more hot spots within the integrated circuit die; and
wherein the integrated circuit package contains a plurality of vias, wherein a first set of the vias connect two or more ground planes in the integrated circuit substrate and a second set of the vias connects two or more power planes in the integrated circuit substrate, wherein a concentration of the vias in the vicinity of the hot spots is higher than a concentration of the vias in areas not in the vicinity of the hot spots.

2. The device of claim 1, wherein the decoupling capacitors are positioned with irregular spacing across the extent of the integrated circuit die.

3. The device of claim 1, further comprising a circuit board having one or more holes formed therein, wherein the holes are positioned so that when the integrated circuit package is mounted to the circuit board, the decoupling capacitors extend through the holes.

4. The device of claim 3, wherein the decoupling capacitors and holes are positioned asymmetrically with respect to the integrated circuit die.

5. The device of claim 3, wherein the circuit board includes a portion that is located under a central portion of the integrated circuit die and positioned to support the integrated circuit die.

6. The device of claim 5, wherein the portion of the circuit board located under the central portion of the integrated circuit package contacts one or more of the connectors on the integrated circuit package.

7. The device of claim 6, further comprising:
a heat sink/spreader which is positioned in thermal contact with the integrated circuit die; and
a coupling configured to apply pressure to the heat sink/spreader to maintain the thermal contact with the integrated circuit die.

8. A device comprising:
a circuit board configured to have an integrated circuit mounted thereto;
wherein the circuit board includes one or more holes formed therein which are positioned to allow one or more decoupling capacitors connected to the integrated circuit to extend therethrough;
wherein the circuit board includes a portion adjacent to the one or more holes which is positioned to support a central portion of the integrated circuit; and
wherein the integrated circuit contains a plurality of vias, wherein a first set of the vias connect two or more ground planes in the integrated circuit and a second set of the vias connects two or more power planes in the integrated circuit, wherein a concentration of the vias in the vicinity of the hot spots is higher than a concentration of the vias in areas not in the vicinity of the hot spots.

9. A method comprising:
providing an integrated circuit package including an integrated circuit die mounted on an integrated circuit substrate;
positioning one or more decoupling capacitors with a higher concentration of the decoupling capacitors at the one or more hot spots within the integrated circuit;
connecting the decoupling capacitors through the integrated circuit substrate to power and/or ground planes within the integrated circuit; and
forming a plurality of vias in the integrated circuit, wherein a first set of the vias connect two or more ground planes in the integrated circuit substrate and a second set of the vias connects two or more power planes in the integrated circuit substrate, and wherein a concentration of the vias in the vicinity of the hot spots is higher than a concentration of the vias in areas not in the vicinity of the hot spots.

10. The method of claim 9, further comprising positioning the decoupling capacitors with irregular spacing across the extent of the integrated circuit die.

11. The method of claim 10, further comprising providing a circuit board and forming one or more holes in the circuit board, wherein the holes are positioned so that when the integrated circuit substrate is mounted to the circuit board, the decoupling capacitors extend through the holes.

12. The method of claim 11, further comprising mounting the integrated circuit substrate to the circuit board.

13. The method of claim 11, further comprising positioning the decoupling capacitors and holes asymmetrically with respect to the integrated circuit die.

14. The method of claim 11, wherein forming the holes in the circuit board includes providing a portion of the circuit board that is positioned to be under a central portion of the integrated circuit die.

15. The method of claim 14, further comprising positioning one or more of the connectors on the integrated circuit substrate to contact the portion of the circuit board positioned under the central portion of the integrated circuit die.

16. The method of claim 15, further comprising:

placing a heat sink/spreader in thermal contact with the integrated circuit die; and applying pressure to the heat sink/spreader to maintain the thermal contact with the integrated circuit die.

* * * * *